United States Patent [19]

Camand et al.

[11] Patent Number: 4,559,503

[45] Date of Patent: Dec. 17, 1985

[54] AMPLIFIER FOR CORRECTING GROUP TIME DELAY OF ELECTRICAL SIGNALS AND AN INTERMEDIATE FREQUENCY AMPLIFIER STAGE FOR RADIO EQUIPMENT COMPRISING AN AMPLIFIER OF THIS KIND

[75] Inventors: Michel Camand, Courbevoie; Jean-Pierre Chobert, Bois Colombes, both of France

[73] Assignee: Alcatel Thomson Faiscequx Hertziens, France

[21] Appl. No.: 696,140

[22] Filed: Jan. 29, 1985

[30] Foreign Application Priority Data

Jan. 31, 1984 [FR] France .................. 84 01465

[51] Int. Cl.⁴ .................................. H03F 3/191
[52] U.S. Cl. ........................... 330/302; 330/310
[58] Field of Search ............... 330/141, 281, 302, 310

[56] References Cited

FOREIGN PATENT DOCUMENTS 2734945 2/1979 Fed. Rep. of Germany .
0723756 3/1980 U.S.S.R. .................. 330/302

OTHER PUBLICATIONS

Wissenschaftliche Berichte A.E.G.—Telefunken, FIG. 9, pp. 153–156, (1970), by Walter Hagele.

Primary Examiner—James B. Mullins
Assistant Examiner—G. Wan
Attorney, Agent, or Firm—Sughrue, Mion, Zinn, Macpeak & Seas

[57] ABSTRACT

An amplifier for correcting group time delay of electrical signals comprises first and second DC voltage supply terminals, an input transistor to which a signal to be amplified is applied, an output transistor, a group time delay corrector network, at least one capacitor and a choke. The input and output transistors have their respective collector-emitter junctions connected in series between the first and second supply terminals. They are configured as common-emitter voltage amplifiers. The collector of the input transistor is connected to the base of the output transistor through the group time delay corrector network. The emitter of the output transistor is connected to one of the supply terminals through the capacitor and to the collector of the input transistor through the choke.

10 Claims, 2 Drawing Figures

AMPLIFIER FOR CORRECTING GROUP TIME DELAY OF ELECTRICAL SIGNALS AND AN INTERMEDIATE FREQUENCY AMPLIFIER STAGE FOR RADIO EQUIPMENT COMPRISING AN AMPLIFIER OF THIS KIND

BACKGROUND OF THE INVENTION

1. Field of the Invention

The present invention concerns an amplifier for correcting group time delay of electrical signals and an intermediate frequency amplifier stage for radio equipment comprising an amplifier of this kind.

2. Description of the Prior Art

Radio receivers comprise, on the input side of their demodulator stage, an intermediate frequency amplifier stage in which means are provided for correcting variations in the amplitude of the signal received due to fading or atmospheric precipitation and for compensating variations in the group time delay due primarily to the intermediate frequency filters at the output side of the frequency changer stage which do not impose the same time delay on all frequencies of the spectrum of the signals applied to the inputs. To correct for group time delay variations a circuit is placed between the input of the amplifier stage and the output of the intermediate frequency filters of the receiver. A disadvantage of this corrector circuit is that it introduces considerable attenuation, on the order of 25 dB. This attenuation is naturally compensated by the amplifier stage, but this compensation nevertheless has the disadvantage of requiring a significant number of transistors to implement the amplifier, to the detriment of the signal-to-noise ratio obtained at the output of the amplifier stage.

The objective of the invention is to alleviate the aforementioned disadvantages.

SUMMARY OF THE INVENTION

To this end, the invention consists in an amplifier for correcting group time delay of electrical signals, comprising first and second DC voltage supply terminals, an input transistor having a collector, an emitter and a base and to which a signal to be amplified is applied, an output transistor having a collector, an emitter and a base, a group time delay corrector network, at least one capacitor and a choke, wherein said input and output transistors have respective collector-emitter junctions connected in series between said first and second terminals, said input and output transistors are configured as common-emitter voltage amplifiers, said collector of said input transistor is connected to said base of said output transistor through said group time delay corrector network, and said emitter of said output transistor is connected to one of said terminals through said at least one capacitor and connected to said collector of said input transistor through said choke.

Another object of the invention is an intermediate frequency amplifier stage for radio equipment having an input and an output and comprising a plurality of group time delay correcting amplifiers as defined hereinabove, a plurality of variable attenuators whereby said amplifiers are connected in series, and an automatic gain control circuit connected to said output of said amplifier stage and adapted to control the attenuation of said attenuators.

The correcting amplifier in accordance with the invention has the advantage that it is made up of a limited number of components which are simple to assemble and consume little power. It provides simultaneously the functions of amplification and correction of group time delay variations whilst having a clearly adequate gain on the order of 15 dB which provides for implementing an intermediate frequency stage for radio equipment featuring very low power consumption and using only three amplifiers in cascade separated by variable attenuators.

Other objects and advantages will appear from the following description of examples of the invention, when considered in connection with the accompanying drawing, and the novel features will be particularly pointed out in the appended claims.

DESCRIPTION OF THE PREFERRED EMBODIMENTS

Figure 1:
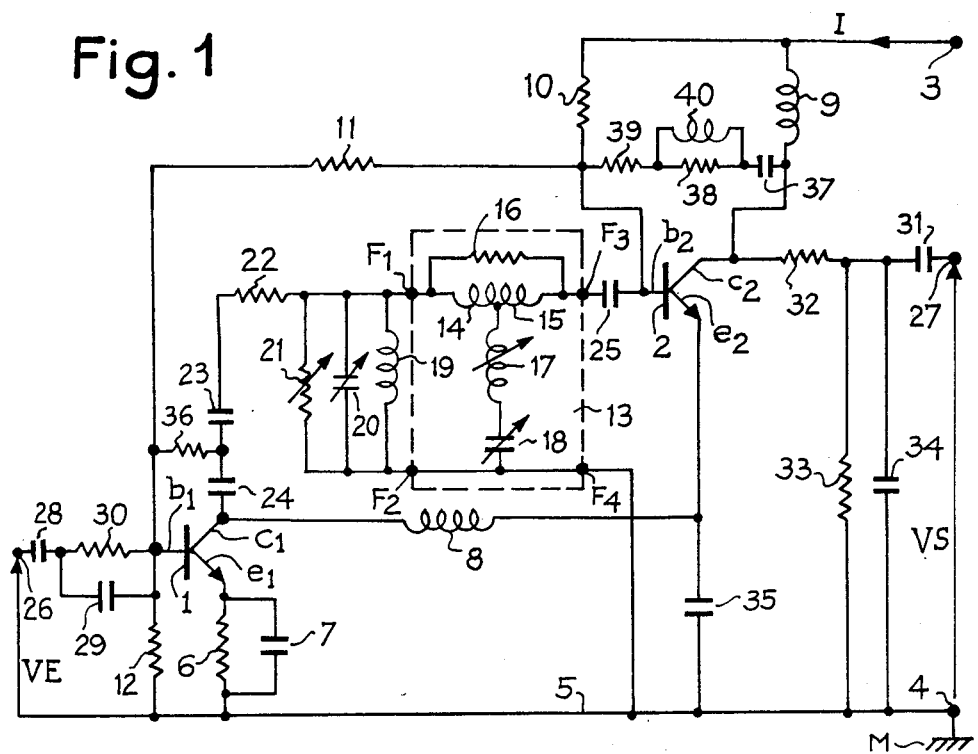
FIG. 1 shows an amplifier in accordance with the invention for correcting group time delay.

The correcting amplifier shown in FIG. 1 comprises two transistors 1 and 2 connected in cascade, each being biased to operate in common-emitter mode.

The collector-emitter junctions of transistors 1 and 2 are connected in series between a first DC voltage supply terminal 3 and a second DC voltage supply terminal 4 of the correcting amplifier. The terminal 4 constitutes the frame ground M of the correcting amplifier and is connected to the circuit of the latter through a ground line 5. The emitter $e_1$ of the transistor 1 is connected to the ground line 5 through a resistor 6 and a capacitor 7 connected in parallel. The collector $c_1$ of the transistor 1 is connected to the emitter $e_2$ of the transistor 2 through a high-frequency coil or choke 8 having a very high impedance for frequencies in the spectrum of the signal to be amplified. The collector $c_2$ of the transistor 2 is connected to the supply terminal 3 of the correcting amplifier through a choke 9 which also has a very high impedance for frequencies in the spectrum of the amplified signal. The DC biasing of the transistors 1 and 2 is obtained by means of a voltage divider bridge formed by resistors 10, 11 and 12 connected in series between the supply terminal 3 and the ground line 5. The base $b_1$ of the transistor 1 is connected to the common point of resistors 11 and 12 and the base $b_2$ of the transistor 2 is connected to the common point of the resistors 10 and 11. The values of the resistors 10, 11 and 12 are adjusted to control the base currents of the transistors 1 and 2 and to enable the transistors 1 and 2 to operate in "class A" mode. The adjustment of the base currents provides for adjustment of the current flowing in the collector-emitter region of each of the transistors connected in series between the supply terminals 3 and 4 through the chokes 8 and 9, the emitter resistor 6 and the ground line 5; this current is virtually equal to the current flowing through the emitter resistor 6.

The collector $c_1$ of the transistor 1 is also connected to the base $b_2$ of the transistor 2 by means of a group time delay corrector network 13 represented within a dashed line frame. The network 13 comprises two input terminals $F_1$ and $F_2$ and two output terminals $F_3$ and $F_4$, the terminals $F_2$ and $F_4$ being connected to the ground line 5.

The network 13 has an all-pass network structure. It comprises an autotransformer with a transformer ratio of ½ consisting of windings 14 and 15 connected in series, a resistor 16 connected between the non-commoned ends of the windings 14 and 15 and a variable inductor 17 connected in series with a capacitor 18 between the median point of the autotransformer common to the windings 14 and 15 and the ground line 5 through terminal $F_4$. The non-commoned ends of the windings 14 and 15 are respectively connected to the input terminal $F_1$ and to the output terminal $F_3$ of the network.

The input terminal $F_1$ of the network is connected to the collector $c_1$ of the transistor 1 by means of a matching circuit formed by an inductor 19, a variable capacitor 20 and a variable resistor 21 connected in parallel between the input terminals $F_1$ and $F_2$ of the network. The input terminal $F_1$ is also connected to the collector $c_1$ of the transistor 1 through a resistor 22, a capacitor 23 and a capacitor 24 connected in series. The output terminal $F_3$ of the network is connected to the base $b_2$ of the transistor 2 through a capacitor 25.

The correcting amplifier also comprises an input terminal 26 to which is applied the signal VE to be amplified and an output terminal 27 on which is obtained the amplified signal VS. The terminal 26 is connected to the base $b_1$ of the transistor 1 through series-connected capacitors 28 and 29. One end of the capacitor 28 is connected to the terminal 26 and one end of the capacitor 29 is connected to the base $b_1$ of the transistor 1. A resistor 30 is connected in parallel with the capacitor 29.

The output terminal 27 of the correcting amplifier is connected to the collector $c_2$ of the transistor 2 through a capacitor 31 and a resistor 32 connected in series, one end of the resistor 32 being connected to the collector $c_2$ of the transistor 2 and one end of the capacitor 31 being connected to the output terminal 27. The point common to the capacitor 31 and to the resistor 32 is connected to the ground line 5 through a resistor 33 and a capacitor 34 connected in parallel. Likewise, the emitter $e_2$ of the transistor 2 is connected to the ground line 5 through a capacitor 35.

The transistor 1 comprises a feedback circuit between its base $b_1$ and its collector $c_1$, formed by the capacitor 24 and a resistor 36 connected in series.

Likewise, the transistor 2 comprises a feedback circuit between its collector $c_2$ and its base $b_2$ formed by a capacitor 37, a resistor 38 and a resistor 39 connected in series. An inductor 40 is connected in parallel with the resistor 38.

In the circuit shown in FIG. 1 the capacitors 7 and 35 have very low impedances in order to decouple the emitters $e_1$ and $e_2$ of the transistors 1 and 2 so that no AC component of the intermediate frequency signals can appear between the emitters $e_1$ and $e_2$ and the ground line 5 of the correcting amplifier. On the other hand, the chokes 8 and 9 have very high impedances at the imtermediate frequency employed so as to block the flow of the alternating current produced at the intermediate frequency between the collector $c_1$ of the transistor 1 and the emitter $e_2$ of the transistor 2 and the alternating current which could flow between the supply terminal and the collector $c_2$ of the transistor 2.

The decoupling arrangements and the mode of biasing the transistors 1 and 2 enable each of the input stages and output stages to operate in common emitter mode, the load of the transistor 1 consisting of the network 13 and the components 19 to 24 and the AC load of the transistor 2 consisting of the components 31 to 34.

Matching of the input stage of the correcting amplifier is effected by means of the capacitors 28 and 29 and the resistor 30 connected in parallel with the capacitor 29. In the embodiment which has just been described the capacitors 28 and 31 have high values of capacitance so that their impedance is very low in comparison with the input impedance of the correcting amplifier and the output impedance of the latter at the operating frequency.

The amplifier stage which has just been described makes it possible to achieve optimum operation of the group time delay correction network.

If $Z_A$ designates the internal impedance of the supply circuit of the network 13, formed by the transistor 1, the components 19 to 21 of the matching circuit and the connecting components 22 to 24 connected between the input terminals $F_1$ and $F_2$ of the network, $Z_B$ designates the base-emitter input impedance of the transistor 2 connected to the output of the network, and $\rho$ designates the value of the resistor 16, optimum operation of the network is obtained if the values of $Z_A$, $Z_B$ and $\rho$ satisfy the following equations:

$$|Z_A| > \rho > |2Z_B| \tag{1}$$

and $$4 \cdot Z_A \cdot A_B = \rho \tag{2}$$

Given these conditions, variations in the frequency of the signal applied to the input of the amplifier have no effect on the amplitude of the output signal, whereas they do affect its phase. The maximum amplitude of the group time delay of the network 13 is adjusted by varying the inductance of the inductor 17 and the capacitance of the capacitor 18.

Figure 2:
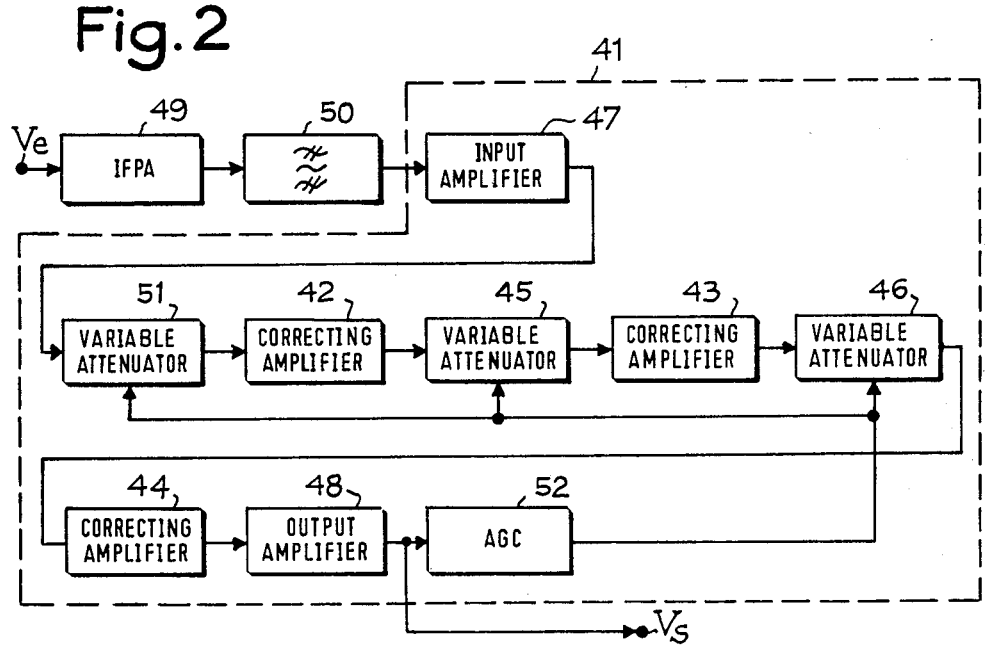
FIG. 2 shows an intermediate frequency amplifier stage obtained by connecting in series a plurality of correcting amplifiers in accordance with the invention.

One embodiment of an intermediate frequency amplifier stage for radio equipment using a plurality of correcting amplifiers in accordance with the invention connected in series will now be described with the assistance of the block diagram shown in FIG. 2. The amplifier stage 41 shown in FIG. 2 comprises a plurality of correcting amplifiers 42, 43 and 44 of the type shown in FIG. 1 connected in series through variable attenuators 45 and 46. The amplifier stage also comprises an input amplifier 47 and an output amplifier 48. The intermediate frequency signal $V_e$ obtained at the output of the frequency changer stage of a radio receiver (not shown) is applied to the input of the input amplifier 47 through an intermediate frequency pre-amplifier 49 and a bandpass filter 50 connected in series. The output amplifier has its input connected to the output of the correcting amplifier 44 and passes to its output the intermediate frequency signal $V_S$ corrected by the correcting amplifiers 42, 43 and 44. The input amplifier 47 has its output connected to the input of the correcting amplifier 42 through the variable attenuator 51. The amplifier stage 41 further comprises an automatic gain control circuit 52 connected to the output amplifier 48 which controls the attenuation ratio of the variable attenuators 45, 46 and 51.

It will be understood that various changes in the details, materials and arrangements of parts which have been herein described and illustrated in order to explain the nature of the invention may be made by those skilled in the art within the principle and scope of the invention as expressed in the appended claims.

There is claimed:

1. Amplifier for correcting group time delay of electrical signals, comprising first and second DC voltage supply terminals, an input transistor having a collector, an emitter and a base and to which a signal to be amplified is applied, an output transistor having a collector, an emitter and a base, a group time delay corrector network, at least one capacitor and a choke, wherein said input and output transistors have respective collector-emitter junctions connected in series between said first and second terminals, said input and output transistors are configured as common-emitter voltage amplifiers, said collector of said input transistor is connected to said base of said output transistor through said group time delay corrector network, and said emitter of said output transistor is connected to one of said terminals through said at least one capacitor and connected to said collector of said input transistor through said choke.

2. Amplifier according to claim 1, wherein said group time delay corrector network comprises an autotransformer with a ratio of ½ consisting of two windings connected in series, a resistor connected between the non-commoned ends of said autotransformer windings, and an inductor and a capacitor connected in series between the commoned ends of said autotransformer windings and one of said terminals.

3. Amplifier according to claim 2, wherein said inductor and said capacitor are of variable impedance.

4. Amplifier according to claim 2, further comprising a matching circuit and wherein said group time delay corrector network has an input connected to said collector of said input transistor through said matching circuit, said output transistor has a base-emitter region, said group time delay network has an output connected to said base-emitter region, and the values $Z_A$ and $Z_B$ of the impedances of said matching circuit and said base-emitter region and the value $\rho$ of said resistor of said group time delay corrector cell are such that $$|Z_A| > \rho > |Z_B| \text{ and } 4 \cdot Z_A \cdot Z_B = \rho^2.$$

5. Amplifier according to claim 1, further comprising a single voltage divider bridge comprising resistors connected in series between said first and second terminals and adapted to produce DC bias voltages for said bases of said input and output transistors.

6. Amplifier according to claim 1, further comprising an emitter resistor for said input transistor and wherein said emitter of said input transistor is connected to said second terminal through said emitter resistor.

7. Amplifier according to claim 6, further comprising a decoupling capacitor connected in parallel with said emitter resistor.

8. Amplifier according to claim 1, further comprising a feedback circuit connected between said collector and said base of said input transistor.

9. Amplifier according to claim 1, further comprising a feedback circuit connected between said collector and said base of said output transistor.

10. Radio amplifier stage having an input and an output and comprising a plurality of group time delay correcting amplifiers, a plurality of variable attenuators whereby said amplifiers are connected in series, and an automatic gain control circuit connected to said output of said amplifier stage and adapted to control the attenuation of said attenuators, wherein each group time delay correcting amplifier comprises first and second DC voltage supply terminals, an input transistor having a collector, an emitter and a base and to which a signal to be amplified is applied, an output transistor having a collector, an emitter and a base, a group time delay corrector network, at least one capacitor and a choke, wherein said input and output transistor have respective collector-emitter junctions connected in series between said first and second terminals, said input and output transistors are configured as common-emitter voltage amplifiers, said collector of said input transistor is connected to said base of said output transistor through said group time delay corrector network, and said emitter of said output transistor is connected to one of said terminals through said at least one capacitor and connected to said collector of said input transistor through said choke.

* * * * *